United States Patent [19]
May et al.

[11] Patent Number: 5,825,826
[45] Date of Patent: Oct. 20, 1998

[54] METHOD AND APPARATUS FOR FREQUENCY DOMAIN RIPPLE COMPENSATION FOR A COMMUNICATIONS TRANSMITTER

[75] Inventors: Michael R. May; Carlos A. Greaves, both of Austin, Tex.

[73] Assignee: Motorola, Inc., Schaumburg, Ill.

[21] Appl. No.: 724,097

[22] Filed: Sep. 30, 1996

[51] Int. Cl.[6] ........................... H04L 27/04; H04L 27/12; H04L 27/20
[52] U.S. Cl. ........................................................... 375/295
[58] Field of Search ..................... 375/295, 296, 375/200; 379/93.01, 93.05, 93.06, 93.16

[56] References Cited

U.S. PATENT DOCUMENTS

| | | | |
|---|---|---|---|
| 5,280,472 | 1/1994 | Gilhousen et al. | 370/18 |
| 5,319,649 | 6/1994 | Raghavan et al. | 371/37.1 |
| 5,537,435 | 7/1996 | Carney et al. | 375/219 |
| 5,574,747 | 11/1996 | Lomp | 375/200 |
| 5,579,124 | 11/1996 | Aijala et al. | 386/96 |
| 5,596,301 | 1/1997 | Rybicki et al. | 331/36 R |
| 5,655,217 | 8/1997 | Lemson | 455/513 |
| 5,678,198 | 10/1997 | Lemson | 455/67.1 |
| 5,715,236 | 2/1998 | Gilhousen et al. | 370/209 |
| 5,729,607 | 3/1998 | DeFries et al. | 380/6 |
| 5,742,527 | 4/1998 | Rybicki et al. | 364/705.05 |

OTHER PUBLICATIONS

Alliance for Telecommunications Industry Solutions, "Asymmetric Digital Subscriber Line (ADSL) Metallic Interface", Draft American National Standard for Telecommunications, Network and Customer Installation Interfaces, T1E.4/94–007R7, pp. i–xii and pp. 2–171.

*Primary Examiner*—Stephen Chin
*Assistant Examiner*—Mohammad Ghayour
*Attorney, Agent, or Firm*—J. Gustav Larson

[57] ABSTRACT

A data stream to be transmitted is received by a digital interface (52) and converted into a frequency encoded data. A gains block (54) receives the frequency encoded data and a gain adjustment signal, and produces a gain adjusted data to compensate for undesirable system level passband gain variation. The gain adjusted data is converted to a time domain data. The time domain data is processed by a high-pass and a droop correction filter (58, 59) to produce a filtered data. The filtered data is provided through an analog front-end (60) in order to provide a filtered analog data.

34 Claims, 5 Drawing Sheets

METHOD AND APPARATUS FOR FREQUENCY DOMAIN RIPPLE COMPENSATION FOR A COMMUNICATIONS TRANSMITTER

FIELD OF INVENTION

Generally the present invention relates to frequency compensation and more specifically to frequency compensation for gain variations in the pass-band of a communications transmitter.

BACKGROUND OF THE INVENTION

In communications art, power spectral density (PSD) templates are specified for transmit signals to assure interoperability among competitive products. It is well understood that frequencies are introduced outside of the desired PSD template range during the process of normal signal preparation. As a result, there is a need to limit these external frequency components. This is accomplished by various filtering techniques which limit frequencies over a specified range. For example, either analog filters or digital filters can be used to provide high-pass and low-pass filter responses. However, such filtering introduces gain variations in the passband portions of the filtered signal. These gain variations include components such as ripple in the passband and "droop", at the passband edge. In addition to gain variations, filters have other effects that need to be considered in a design process, such as impulse response length and group delay variation, each of which can introduce undesirable results.

It is generally desirable to maximize the attenuation in the stopband, while minimizing gain variation in the passband. However, there is a fundamental trade off between the gain variation in the pass-band, and the attenuation present in the transition band and the stop band. For a filter of a given order, an increase in attenuation in the stopband causes an increase in gain variation in the passband. Likewise, a filter of the same order designed to minimize gain variation in the passband would result in decreased attenuation in the stopband. High order filters are generally needed, in order to minimize the gain variation components in the pass-band and maximize the stopband attenuation.

The use of high-order filters is costly in terms of design size, complexity, and power. As a result, design engineers must choose between the use of high-order costly filters and lower order less efficient filters when striving to meet design specifications. Therefore, it would be advantageous to implement a filtering scheme that reduces the complexity and cost of the dedicated transmit filter.

DETAILED DESCRIPTION OF THE DRAWINGS

FIGS. 4-1–4-4 illustrate, in graphical form, a series of frequency domain wave forms and scale factors in accordance with the present invention.

DETAILED DESCRIPTION OF THE INVENTION

In operation, the present invention receives a data stream to be transmitted. The data stream is converted by a digital interface into a frequency encoded data. A gains block receives the frequency encoded data and a gain adjustment data. Based on the gain adjustment data, the frequency encoded data generates a gain adjusted data. The gain adjusted data is converted to a time domain data. The time domain data is processed by a high-pass and a droop correction filter to produce a filtered data. The filtered data is provided through an analog front-end in order to provide a filtered analog data.

Connectivity of the Invention

In the following description of the connectivity of the present invention, the term "bus" will be used to relate to the plurality of signals or conductors which may be used to transfer one or more of various types of information such as data, addresses, control, or status. The terms "assert" and "negate" will be used to refer to the rendering of a signal, status fit, or similar apparatus into its logically true or logically false state respectively. If the logically true state is a logic level one, the logically false state will be a logic level zero. If the logically true state is a logic level zero, the logically false state would be a logic level one.

Figure 2:
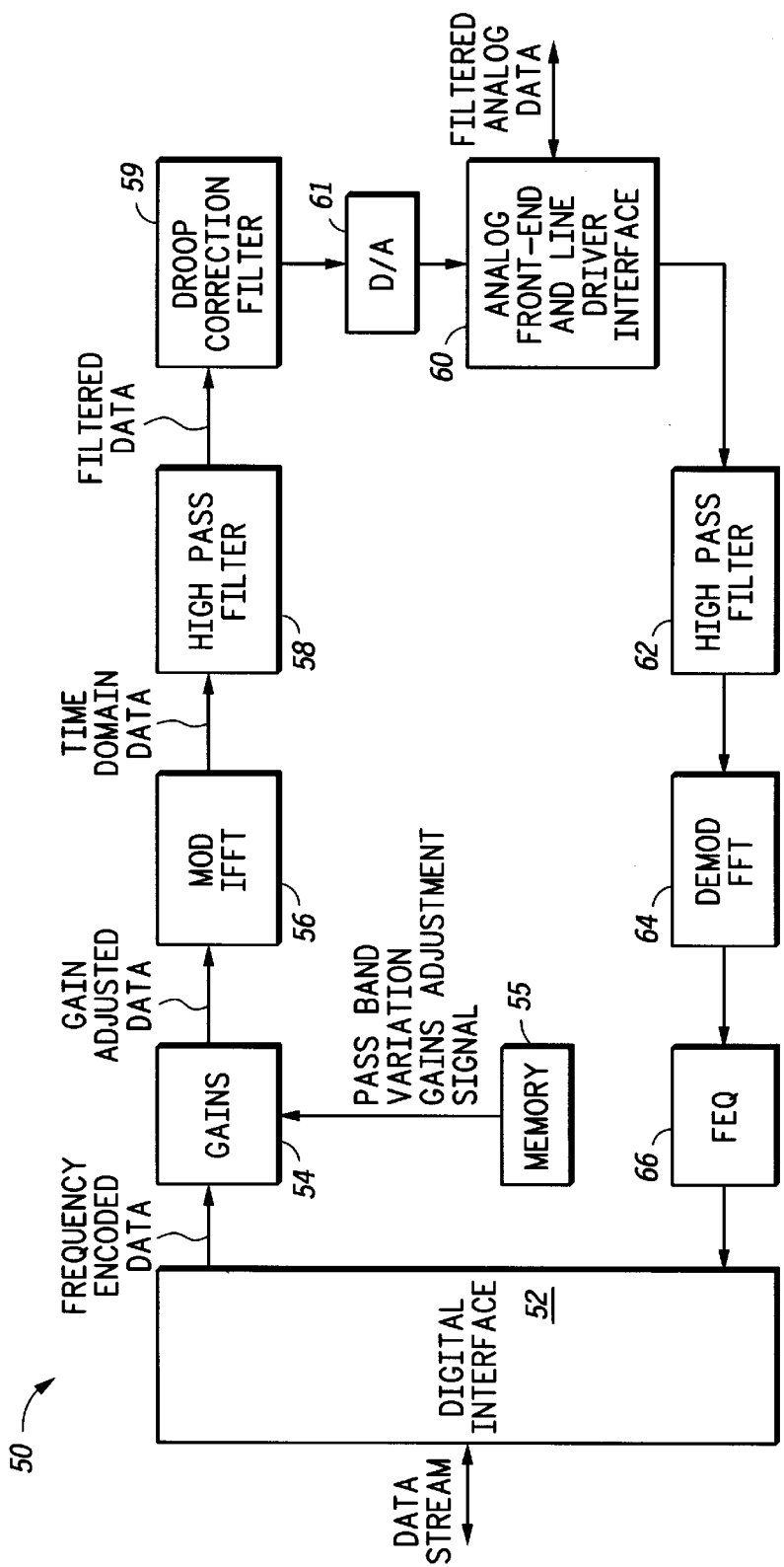
FIG. 2 illustrates, in block diagram form, a communications transceiver in accordance with the present invention.

FIG. 2 illustrates, in block diagram form, an ADSL transceiver 50 which is representative of an Asymmetric Digital Subscriber Lines (ADSL) transmitter unit remote terminal end (ATU-R) or an ADSL transceiver central office end (ATU-C). The portion of ADSL transceiver 50 comprises a digital interface 52, a gain circuit 54, an inverse fast transform (IFFT) 56 circuit, a high-pass filter 58, a droop correction filter 59, an analog front-end 60, a high-pass filter 62, a fast transform (FFT) portion 64, and a frequency equalizer (FEQ) portion 66. Digital interface 52 communicates information via a data stream. Digital interface 52 is coupled to gain circuit 54 to provide a frequency encoded data stream. Gain circuit 54 is coupled to IFFT 56 to provide a gain adjusted data stream. IFFT 56 is coupled to high-pass filter 58 to provide a time domain data stream. High-pass filter 58 is coupled to droop correction filter 59 to provide a filtered data stream. Droop correction filter 59 is coupled to analog front-end 60 to provide a droop filter corrected data stream. Analog front-end 60 bidirectionally communicates a filtered analog data stream. Analog front-end 60 is coupled to high-pass filter 62 to provide a representation of the filtered analog data stream. High-pass filter 62 is coupled to FFT 64 to provide a high-pass filtered data stream. FFT 64 is coupled to FEQ 66 to provide a transformed data stream. FEQ 66 is coupled to digital interface 52.

Description of Operation

Figure 1:
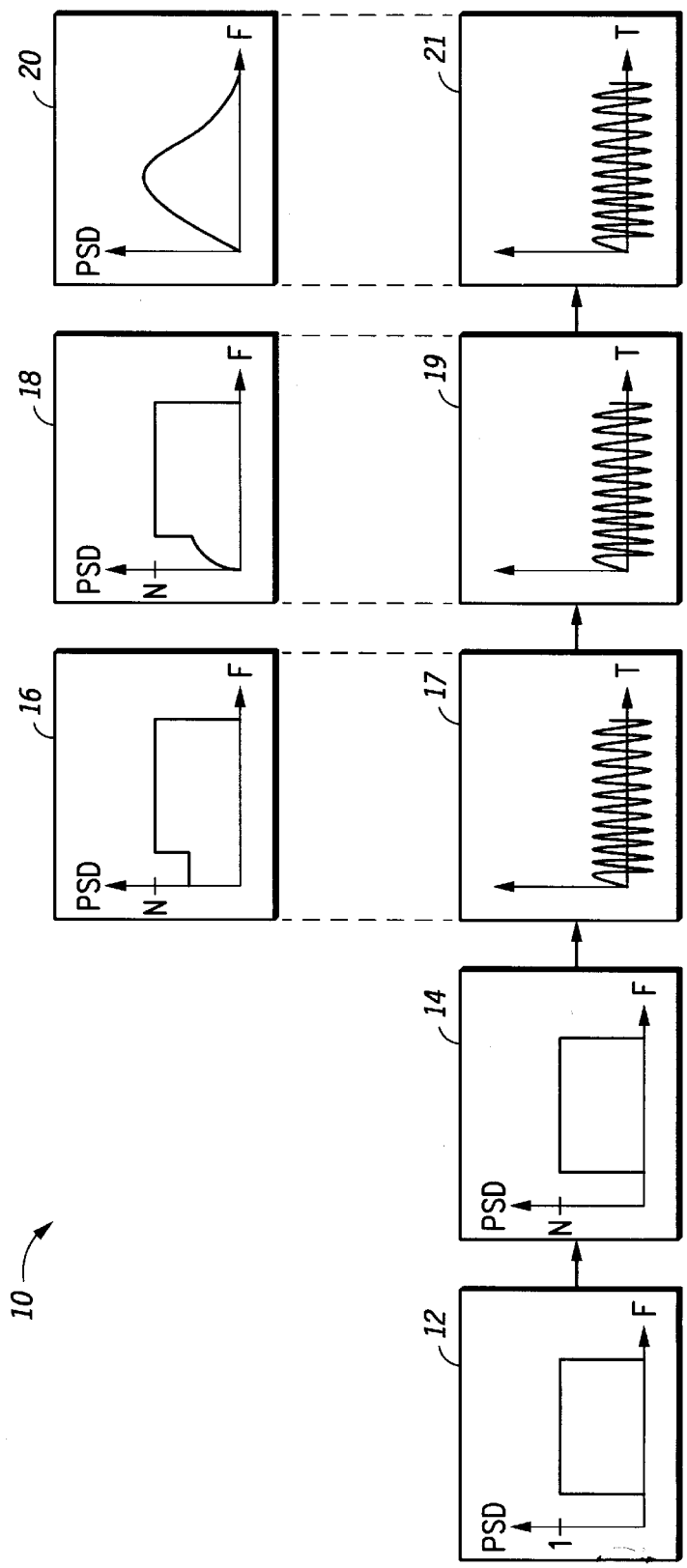
FIG. 1 illustrates, in graphical form, a series of frequency and time domain graphs for a communications transceiver.

FIG. 1 illustrates a diagram 10 showing the effects of a noncompensated communications system on a data stream input. The communications system of FIG. 1 is representative of an Asymmetric Digital Subscriber Lines (ADSL) system. This figure illustrates undesired gain variations which are the result of practical limitations of filtering techniques.

Block 12 illustrates a data stream representation in the frequency domain. The data stream is represented by a power spectral density (PSD) on the Y-Axis which is normalized to one. The data stream has a constant PSD component across its frequency range. Block 14 illustrates the data stream of block 12 following a gain stage. The gain stage introduced a gain, or scale factor, of N to the data stream to create a gain adjusted data stream. Block 17 illustrates the gain adjusted data stream of block 14 following a conversion from the frequency domain to the time domain. This conversion introduces additional frequency components which are illustrated in block 16 which is a frequency domain representation of the signal represented in block 17. For illustration purposes, the unwanted signal component, or noise, where noise is any undesirable energy variation from the ideal, is represented as being at the low end of the frequency spectrum which previously contained no frequency information. Additionally, it should be noted that additional frequency components, as represented in block 16, is present at a magnitude somewhat smaller than the full gain representation of the remainder of the signal.

Block 19 represents the signal of block 17 following a high-pass filtering stage. Note that the representations of the time domain signals of block 17 and block 19 show no useful information. Therefore, frequency domain representations for the time domain blocks 17, 19 and 21 are provided. The frequency domain representation of the signal of block 19 is shown in block 18. In block 18 it can be seen that the low frequency components of the signal of block 19 has been filtered, causing the low frequency attenuation. Finally, at block 21, the signal of block 19 is shown after being processed by an analog front-end. The analog front-end would include a line driver for presenting processed information onto a final transmitting media. The signal of block 20 represents the frequency domain representation of the signal of block 21.

FIG. 1 illustrates the effect of communication system data processing on a data stream. The unwanted signal components can be caused by a number of factors, including frequency to time domain conversion, and interpolation associated with a sigma-delta digital to analog converter (DAC). The unwanted signal component is represented in block 20 by low and high frequency energy outside of a desired PSD template, which has an ideal shape representative by the signal of block 12. In other words, in an ideal situation, the data stream signal of block 20 would substantially be represented by the data stream shape of 12.

In an ADSL system, which is one embodiment of a communication system, the proposed specification requires that the attenuation and ripple in the pass-band be limited to no more than 3 dB. Only a limited portion of the 3 dB of allowable gain variation is available to the filters generating the signal represented in FIG. 1. For example, only 1.5 dB may be available to the analog portions of the circuitry which produce the signals of FIG. 1. As a result of this limitation, it is important that the effects described in FIG. 1 introduce no more than the 1.5 dB of gain variation as determined by the specification. Satisfying this specification results in the use of expensive high-order filters.

FIG. 2 illustrates an ADSL communications transceiver 50. The transceiver 50 is representative of both an ADSL transmitter unit remote terminal end (ATU-R) and an ADSL transceiver central office end (ATU-C). While an ADSL implementation is shown, it is understood that the present invention is not limited specifically to ADSL communications technologies.

In operation, a data stream is received by the digital interface 52. The data stream represents some data desired to be transmitted. For example, digital video would be a potential source of the data stream represented. The digital interface 52 converts the receive data into a frequency encoded data. For an ADSL system, the frequency encoded data would be represented in a number of frequency bins. Wherein, for each frequency bin, or region, a frequency encoded signal is representative of a certain number of bit values.

A gains block 54 receives the frequency encoded data, and a pass-band variation gains adjustment signal. The pass-band variations gain adjustment signal contains a gain adjustment data for specifying a gain to be applied to specific frequencies of the frequency encoded data. The purpose of the pass-band variation adjustment signal is to adjust at an early stage those portions of the final filtered analog data known to contain passband variation. Based on the pass-band variation gains adjustment signal, an overall gain is calculated and applied to the frequency encoded data. The passband variation gains adjustment data, which represents the gain adjustment needed for the frequency encoded bins, can effect the data stream in numerous manners. For example, the pass-band variations gains adjustment signal could specify an incremental gain for each specific bin of the frequency encoded data; or the gains adjustment signal could represent an incremental gain value to be applied to a frequency range which includes a number of bins.

The pass-band variations gains adjustments signal can also be represented in a number of ways, and is not intended to be limited by the examples below. For example, an equation could be used to generate the pass-band variation gains adjustment signal. This would be accomplished by providing a given frequency, or frequency range, information to the equation and utilizing the result. Also, a table could be used to access the gain adjustment signal for a given frequency or a frequency range. These equations, or tables, could be generated externally by a user based on observed results, or could be obtained by a training algorithm implemented in an integrated fashion with a communications transceiver, such as transceiver 50. These options will be discussed further below.

Next, at block 56, an inverse fast transform (IFFT) is performed on the gain adjusted data in order to convert the frequency information into the time domain. The time domain data is further filtered by the high-pass filters 58 and the droop correction filter 59. The filters 58 and 59 are implemented to further obtain the desired PSD template as specified. The filtered data provided by the droop correction filter 59 is received by the analog front-end and line driver interface 60.

The analog front-end and line driver interface block 60 includes a variety of on and off-chip transmit components, including: an interpolating filter; a sigma delta modulator; a conventional digital-to-analog converter (DAC); a smoothing filter and; a transmit driver. Additionally, on-chip receive components would include: an attenuator for receiving data from the line; a programmable equalizer for providing gain to small signals; and an analog-to-digital converter (ADC). In one implementation, the off-chip portions of the analog front-end and line interface block 60 would include the line driver, and a hybrid component common to both transmitting and receiving data. The hybrid component is used to interface the ADSL transceiver 50 to a transmission media (not shown) by separating the transmitted data from received data.

Data received by the analog front-end and line driver interface 60 is passed by the high-pass filter block 62. This block removes low frequency components and is well understood in the art and will not be discussed further. The information from the high-pass filter block 62 is received by the time-to-frequency conversion block 64, which in this implementation implements a fast transform (FFT). The frequency domain output of block 64 contains encoded data in frequency bins. The frequency domain information from the FFT 64 is coupled to a frequency equalization block (FEQ) 66. The FEQ 66 provides any necessary equalization among the bins of the received signal. The FEQ 66 is coupled the digital interface 52. The frequency encoded data received from block 66 is decoded by the digital interface 52 to recover the encoded data.

Figure 3:
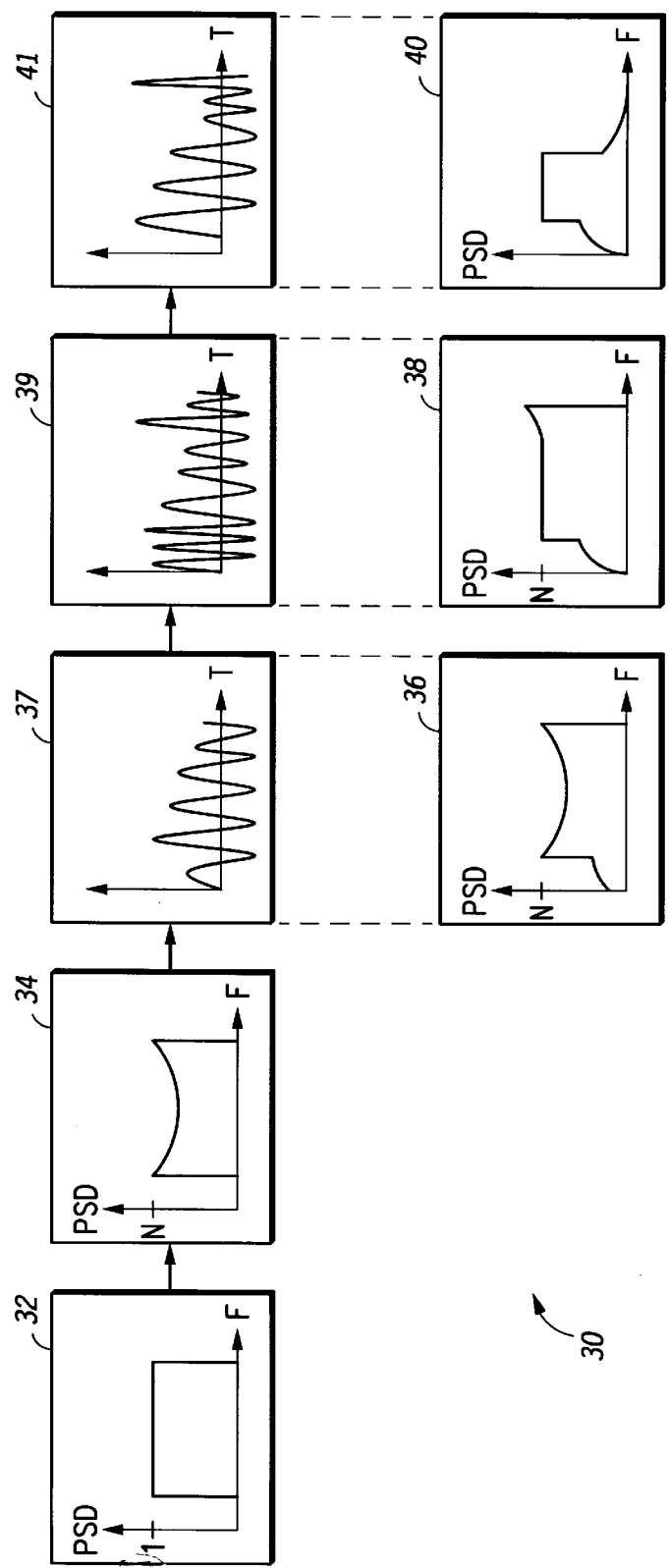
FIG. 3 illustrates, in graphical form, a series of time and frequency domain graphs for a communications transceiver in accordance with the present invention.

FIG. 3 illustrates a diagram 30 showing the effects of an ADSL communication transceiver 50 of FIG. 2 on a data stream. Block 32 illustrates a PSD representation of a digital data stream containing frequency encoded data from the digital interface 52 of FIG. 2. Block 34 illustrates the gain to the signal of block 32 that is dependent on the pass band variation gains adjustment signal. In block 34 of FIG. 3 it can be seen that not only has a gain been applied, but a pass-band variations gains adjustment component has been added. (Compare to block 14 of FIG. 1). Note, in a normal operation the gain block 34 would provide gain to the data stream as necessary, and that for purposes of discussion only the pass band variation adjustment is illustrated in FIG. 3.

The frequency domain signal of block 34 is converted to a time domain signal the IFFT block 56 of FIG. 2. The resulting signal is represented in block 37 of FIG. 3. Block 36 illustrates a frequency domain representation of the signal of block 37. The IFFT conversion introduces a low frequency signal component and is illustrated in block 36. Next, the signal of block 37 is high-pass filtered to attenuate the additional low frequency component and is represented in the time domain in block 39. As shown in block 38, which is a frequency domain representation of block 39, an attenuation of the additional low frequency component's signal occurred. The high-pass filtered signal from block 39 is processed through the analog front-end 60 as represented in FIG. 2. Following this final filtering, the time domain signal 41, as represented by frequency domain signal 40, can be seen to much more closely proximate the input signal of block 32 than does its counter-part of block 20 in FIG. 1.

Therefore, it can be seen by utilizing the gains block 54, of FIG. 2, to compensate for known gain variations, a cleaner signal is ultimately realized as illustrated in block 40. Modifying the signal in the gains block 54 allows a lower order block filter to be used at steps 58 and 59, allowing for a more cost effective, space efficient design to be implemented.

Figure 4:
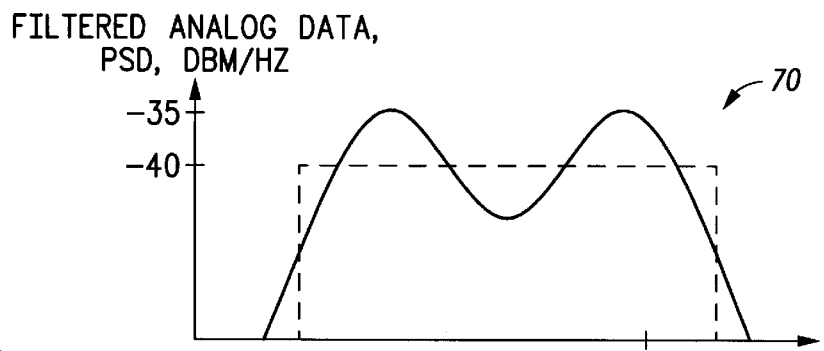
Figure 5:
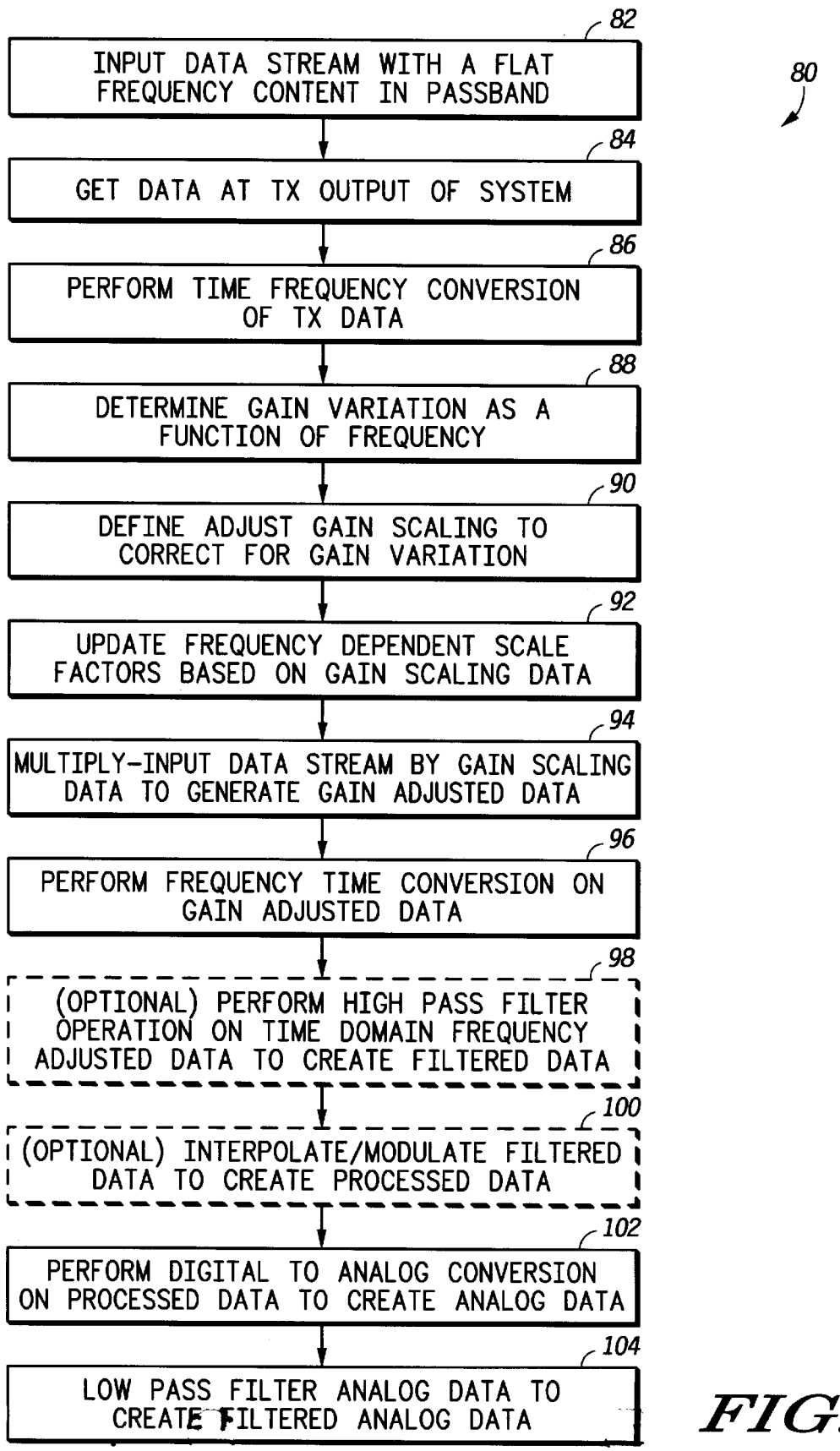
FIG. 5, illustrates, in flow diagram form, a method of signal correction in accordance with the present invention.

FIG. 4 represents a sequence of figures, FIGS. 4-1 through 4-5, illustrating a sequence of waveform and scale factor diagrams for determining the pass-band variation gains adjustment signal of FIG. 2. FIG. 4-1 represents a PSD plot of the filtered analog data as would be transmitted from the analog front-end 60 of FIG. 1. The y-axis of the graph of FIG. 4-1 represents dBm/Hz while the x-axis represents frequency.

An ideal PSD plot is represented in FIG. 4-1 by a dashed line. This ideal signal has sharp edges defining the passband. A representative PSD signal, which would likely be present, is illustrated by a solid line. The representative signal has ripple in the pass-band range, and droop components which occur at the beginning and end of the pass-band. As previously discussed, the representative signal varies from the desired PSD signal in that through the use of economically feasible filtering techniques, non-ideal gain variations occur within the pass-band. For purposes of example, at a frequency, fx, the ideal PSD is −40 dBm/Hz, while the representative PSD is −35 dBm/Hz.

FIG. 4-2 is a plot illustrating the difference between the ideal and representative PSDs of FIG. 4-1. It should be noted that in other embodiments, the ideal PSD could actually be a desired PSD which has gain variations defined. It should be further noted that FIG. 4-2 only illustrates the differences within the passband area of the ideal, and this is not meant as a limitation. At frequency fx there is a difference of 5 dB.

FIG. 4-3, represents an inverse of the plot of FIG. 4-2. The frequency fx is −5 dB. This value, if combined with the representative plot of FIG. 4-2, would provide the ideal PSD plot value of −40 dBm/Hz. This can be accomplished through the present invention by generating the pass-band variation gains adjustment signal, as received by block 54 of FIG. 2, from the signal information of FIG. 4-3. The passband variation gains signal can be defined by providing an equation to represent the plot of FIG. 4-3, by implementing a table of values representing the plot values of FIG. 4-3, or any other appropriate manner. This allows the signal of block 34 of FIG. 3 to be generated. In the manner previously discussed, a filtered analog data signal is ultimately received from the analog front-end and line interface block 60 of FIG. 2, that more closely approximates an ideal signal. FIG. 4-5 represents this filtered data analog data signal with the invention observed. Note that while the plot of FIG. 4-5 appears to match the ideal signal of FIG. 4-1, variations may be obtained due to process variations or other distortion which has not been accounted for in the present discussion.

An equation derived from the plot of FIG. 4-3 is used to generate the pass-band variations adjust signal of FIG. 2, would allow values to be calculated for any desired frequency. If the pass-band variation adjust signal is table generated, a memory portion (not shown in FIG. 2) would be used to store the table data for access by the gains portions 54.

FIG. 5 illustrates a method 80 for obtaining a pass-band variations gain adjustment signal as received by block 54 of FIG. 2. At step 82, an input data stream with a pre-selected frequency content in the pass-band is received. The frequency content would include the frequency ranges and the amplitudes at those frequencies such that the PSDs could be determined. Next, at step 84, data at the transmitter output of a communication system is received. Next, at step 86, frequency domain analysis is performed on the data received at the output of the system. Next, at step 88, gain variation as a function of frequency is determined based on the frequency domain analysis data of step 86. Next, at step 90, a gain scaling to correct for gain variation is defined. Next, at step 92, frequency dependent scale factors are updated based on the gain scaling data.

The update of step 92 could be in the form of generating a new equation to represent the gain variations to be corrected for, producing tables containing appropriate scaling factors, or any other appropriate format. Next, at step 94, a frequency representation of the input data stream as provided in step 82 is multiplied by the gain scaling data generated in step 92. Next, at step 96, the frequency representation of step 94 is converted to a time representation to generate a gain adjusted signal. Next, at step 98, a high-pass filtering operation is performed on the gain adjusted data to create a filtered data. Next, at step 100, the filtered data is interpolated or modulated to create a processed data. Next, at step 102, a DAC conversion is performed on the processed data to create an analog data. Next, at step 104, a low-pass filtering function is applied to the analog data in order to create an analog filtered data.

The steps 94 though 104 can be repeated on any new data received by the digital interface 52 as represented in FIG. 2. However, the filtering functions of the analog front-end and the ADSL communication transceiver 50 will generally be fixed, and once determined should not change. As such, the steps 82 through 92 of method 80 could be performed by a user and provided to the transceiver, or could be dynamically determined by the system 50 and stored for further use and re-calculated dynamically as needed by the system.

It should now be apparent that by determining a distortion inherent to a communication system, and adjusting for the distortion amount during an initial gain adjusts step, that overall system performance can be improved. This improvement is further achieved through a techniques that minimizes system overhead, in that the gain adjust portion of the circuit already exists, and by further utilizing this pre-existing circuitry other portions of the communications device may also be minimized in terms of size and cost.

It should be understood that while a specific, ADSL implementation, of the present invention has been presented that other inventions are not excluded. For example, other discreet multi-tone implementations aside from ADSL could benefit from the present invention. Or more specifically, the gains adjustment with reference to FIG. 4 is shown to occur only within the ideal passband, in fact, it may be desirable to adjust for effects outside the ideal passband. When roll-off outside of the pass band is taken into account, it is understood that the passband variation gains adjustment signal would have gain components outside of the passband specified. In general, the any system which has information encoded in the frequency domain could benefit through the use of the present invention.

We claim:

1. A transmitter for providing a filtered data stream, comprising:
    an interface circuit for receiving a data stream and for generating a frequency encoded data stream; and
    a gain circuit coupled to the interface circuit for receiving the frequency encoded data stream, the gain circuit scaling the frequency encoded data stream by a scale factor to create an adjusted data stream, wherein the scale factor generates a desired passband variation in the filtered data stream.

2. The transmitter of claim 1, further comprising:
    a conversion circuit for converting the adjusted data stream from a frequency domain to a time domain to generate a time domain data stream, the conversion circuit being coupled to the gain circuit to receive the adjusted data stream.

3. The transmitter of claim 2 wherein the conversion circuit is an inverse fast Fourier transform (IFFT).

4. The transmitter of claim 2, further comprising:
    a filter for filtering a portion of the time domain data stream to generate the filtered data stream.

5. The transmitter of claim 4 wherein the scale factor is an inverse of a variation introduced into the filtered data stream by the filter.

6. The transmitter of claim 4, further comprising:
    a digital to analog converter coupled to the filter for receiving the filtered data stream, the digital to analog converter converting the filtered data stream to a filtered analog data stream.

7. The transmitter of claim 1 wherein the transmitter is compliant with an ADSL standard.

8. The transmitter of claim 1, further comprising:
    a memory for storing the scale factor, the memory being coupled to the gain circuit for providing the scale factor.

9. The transmitter of claim 1 wherein the scale factor is one of a plurality of scale factors, each of the plurality of scale factors corresponding to a preselected frequency value.

10. The transmitter of claim 9, further comprising:
    a memory for storing each of the plurality of scale factors.

11. The transmitter of claim 1 wherein the scale factor is one of a plurality of scale factors, each of the plurality of scale factors corresponding to a preselected frequency range.

12. The transmitter of claim 11, further comprising:
    a memory for storing each of the plurality of scale factors.

13. The transmitter of claim 1 wherein the scale factor is calculated by an external source.

14. The transmitter of claim 1, further comprising:
    a training circuit for generating the scale factor.

15. The transmitter of claim 1 wherein the filtered data stream includes an undesired passband variation.

16. The transmitter of claim 15 wherein the undesired passband variation includes a ripple variation.

17. The transmitter of claim 15 wherein the undesired passband variation includes a droop variation.

18. A method for operating a transmitter, comprising the steps of:
    receiving a data stream;
    determining a data stream power spectral density;
    determining a variation between the data stream power spectral density and an ideal power spectral density;
    generating a gain adjustment in response to the variation; and
    adjusting the data stream power spectral density using the gain adjustment to be substantially identical to the ideal power spectral density.

19. The method of claim 18, further comprising the step of:
    determining the ideal power spectral density.

20. The method of claim 19 wherein the step of determining the ideal power spectral density, further comprises the step of:
    providing an input data stream with a flat passband frequency response.

21. The method of claim 18, further comprising the step of:
    converting the data stream from a time domain to a frequency domain before determining the variation between the data stream power spectral density and the ideal power spectral density.

22. A method for operating a communication system, comprising the steps of:
    providing an input data stream to the communication system with an ideal frequency response;
    obtaining a data stream from the communication system in response to the input data stream;
    converting the data stream from a time domain to a frequency domain to generate a frequency encoded data stream;
    determining a gain variation between the ideal frequency response and a response of the frequency encoded data stream;
    defining a gain factor to compensate for the gain variation; and
    scaling the frequency encoded data stream by the gain factor to generate a gain adjusted data stream.

23. The method of claim 22, further comprising the step of:

updating the gain factor in response to the gain variation.

24. The method of claim 22, further comprising the step of:

converting the gain adjusted data stream from the frequency domain to the time domain to generate a time domain data stream.

25. The method of claim 24, further comprising the step of:

performing a filter operation on the time domain data stream to create a filtered data stream.

26. The method of claim 25, further comprising the step of:

interpolating the filtered data stream to create a processed data stream.

27. The method of claim 25, further comprising the step of:

modulating the filtered data stream to create a processed data stream.

28. The method of claim 25, further comprising the step of:

converting the filtered data stream from a digital data stream to an analog data stream.

29. The method of claim 28, further comprising the step of:

low pass filtering the analog data stream to create a filtered analog data stream.

30. The method of claim 22 wherein a step of scaling the frequency encoded data stream, further comprises a step of:

multiplying the frequency encoded data stream by the gain factor to generate the gain adjusted data stream.

31. A communication system, comprising:

a digital interface for receiving a data stream; and a scaling circuit for selectively scaling the data stream by a scale factor to provide an adjusted data stream, the scale factor being determined in response to a variation between an ideal power spectral density of an input signal and an actual power spectral density of the input signal.

32. The communication system of claim 31 wherein the data stream is in a frequency domain.

33. The communication system of claim 31, further comprising:

transform means for transforming the adjusted data stream from a frequency domain to a time domain to generate a time domain data stream.

34. The communication system of claim 33, further comprising:

a filter for filtering the time domain data stream to generate a filtered data stream.

* * * * *